US010649533B2

(12) United States Patent
Chang et al.

(10) Patent No.: US 10,649,533 B2
(45) Date of Patent: May 12, 2020

(54) TOUCH-CONTROL PANEL AND TOUCH-CONTROL DEVICE FOR PROVIDING TACTILE FEEDBACK AND METHOD THEREOF

(71) Applicant: Shanghai Tianma Micro-Electronics Co., Ltd., Shanghai (CN)

(72) Inventors: Dong Chang, Shanghai (CN); Yuan Ding, Shanghai (CN); Donghua Chen, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/174,656

(22) Filed: Oct. 30, 2018

(65) Prior Publication Data

US 2020/0033946 A1 Jan. 30, 2020

(30) Foreign Application Priority Data

Jul. 27, 2018 (CN) .......................... 2018 1 0841329

(51) Int. Cl.
*G06F 3/045* (2006.01)
*G06F 3/01* (2006.01)
*B06B 1/06* (2006.01)
*G06F 3/044* (2006.01)
*H01L 41/047* (2006.01)
(Continued)

(52) U.S. Cl.
CPC ............ *G06F 3/016* (2013.01); *B06B 1/0688* (2013.01); *G06F 3/044* (2013.01); *H01L 41/0477* (2013.01); *H01L 41/0805* (2013.01); *H01L 41/09* (2013.01); *G06F 3/0416* (2013.01); *G06F 3/0443* (2019.05); *G06F 3/0445* (2019.05); *G06F 3/0446* (2019.05); *G06F 3/04886* (2013.01); *G06F 2203/04809* (2013.01); *H01L 41/0478* (2013.01); *H01L 41/0986* (2013.01); *H01L 41/187* (2013.01); *H01L 41/193* (2013.01)

(58) Field of Classification Search
CPC ........ G06F 3/016; G06F 3/044; G06F 3/0416; G06F 3/0443; G06F 3/0445; G06F 3/0446; G06F 3/04886; H01L 41/0477; H01L 41/09; H01L 41/0805; H01L 41/0478; H01L 41/0986; H01L 41/187; H01L 41/193; B06B 1/0688
USPC ........................................................ 345/173
See application file for complete search history.

(56) References Cited

U.S. PATENT DOCUMENTS

2010/0156818 A1* 6/2010 Burrough ............... G06F 3/016
345/173
2012/0068957 A1* 3/2012 Puskarich .............. G06F 3/016
345/174
(Continued)

FOREIGN PATENT DOCUMENTS

CN 104281328 A 1/2015

*Primary Examiner* — Adam J Snyder
(74) *Attorney, Agent, or Firm* — Anova Law Group PLLC

(57) ABSTRACT

A touch-control panel includes a display panel and at least one actuator. The display panel includes a touch-control detection device. Each actuator of the at least one actuator includes a first electrode, a second electrode, and an inductive layer sandwiched between the first electrode and the second electrode. In response to the touch-control detection device detecting a touch-control operation, an actuator of the at least one actuator located in a region where the touch-control operation is performed vibrates.

19 Claims, 11 Drawing Sheets

(51) Int. Cl.
    *H01L 41/08*     (2006.01)
    *H01L 41/09*     (2006.01)
    G06F 3/041     (2006.01)
    H01L 41/187     (2006.01)
    H01L 41/193     (2006.01)
    G06F 3/0488     (2013.01)

(56) References Cited

U.S. PATENT DOCUMENTS

| | | | |
|---|---|---|---|
| 2014/0082490 A1* | 3/2014 | Jung | G06F 3/016 |
| | | | 715/702 |
| 2017/0364158 A1* | 12/2017 | Wen | G06F 3/016 |
| 2018/0081441 A1* | 3/2018 | Pedder | G06F 3/016 |

* cited by examiner

TOUCH-CONTROL PANEL AND TOUCH-CONTROL DEVICE FOR PROVIDING TACTILE FEEDBACK AND METHOD THEREOF

CROSS-REFERENCES TO RELATED APPLICATIONS

This application claims the priority of Chinese patent application No. 201810841329.9, filed on Jul. 27, 2018, the entirety of which is incorporated herein by reference.

FIELD OF THE DISCLOSURE

The present disclosure generally relates to the field of display technology and, more particularly, relates to a touch-control panel and driving method thereof, and a touch-control device.

BACKGROUND

With the development of display technology, the functions of display products become more and more diversified to meet the needs of different users and in different scenarios. Display products with touch-control functions have the advantages of simple operation, fast response, rich features, desired ability to interact with users, etc., and thus are favored by users.

A touch-control display device according to the existing technology has a tactile feedback function. That is, when a touch-control operation of a user is detected, a certain mechanical stimulus is given to the user. In the existing technology, tactile feedback may be provided to the user through an eccentric rotation mass (ERM) actuator. When a touch-control operation of the user is detected, the ERM actuator drives the touch-control device to vibrate, and thus provides the user a mechanical stimulus.

However, according to the existing technology, the ERM actuators in touch-control devices with tactile feedback functions may have problems of large vibration noise, slow response speed, high power consumption. In addition, the ERM actuator may vibrate monotonically, and thus may not be able to provide the users more diversified forms of mechanical stimulation.

The disclosed touch-control panel and driving method as well as the disclosed touch-control device are directed to solve one or more problems set forth above and other problems in the art.

BRIEF SUMMARY OF THE DISCLOSURE

One aspect of the present disclosure provides a touch-control panel. The touch-control panel includes a display panel and at least one actuator. The display panel includes a touch-control detection device. Each of the at least one actuator includes a first electrode, a second electrode, and an inductive layer sandwiched between the first electrode and the second electrode. In response to the touch-control detection device detecting a touch-control operation, an actuator of the at least one actuator located in a region where the touch-control operation is performed vibrates.

Another aspect of the present disclosure provides a driving method for a touch-control panel. The touch-control panel includes a display panel, at least one actuator, and a central processing module. The display panel includes a touch-control detection device. Each actuator of the at least one actuator includes a first electrode, a second electrode, and an inductive layer sandwiched between the first electrode and the second electrode. The touch-control detection device is connected to the central processing module, and the at least one actuator is connected to the central processing module. The driving method includes in response to the touch-control detection device detecting a touch-control operation, receiving position information of the touch-control operation by the central processing module, and controlling an actuator of the at least one actuator located in a region where the touch-control operation is performed to vibrate.

Another aspect of the present disclosure provides a touch-control device. The touch-control device includes a touch-control panel. The touch-control panel includes a display panel and at least one actuator. The display panel includes a touch-control detection device. Each actuator of the at least one actuator includes a first electrode, a second electrode, and an inductive layer sandwiched between the first electrode and the second electrode. In response to the touch-control detection device detecting a touch-control operation, an actuator of the at least one actuator located in a region where the touch-control operation is performed vibrates.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to various exemplary embodiments of the present disclosure, which are illustrated in the accompanying drawings. It should be noted that the relative arrangement of the components and steps, numerical expressions and values set forth in the embodiments are not intended to limit the scope of the present disclosure. The following descriptions of the various exemplary embodiments of the present disclosure are merely illustrative and, by no means, are intended to limit the application or use of the present disclosure.

The techniques, methods, and devices that are known to those of ordinary skill in the relevant art may not be discussed in detail in the present disclosure, but where appropriate, the techniques, methods, and devices should be considered as part of the specification.

In the embodiments shown and discussed herein, any specific values should be construed as illustrative only and are not intended to limit the scope of the present disclosure. Therefore, different values may be adopted in other exemplary embodiments.

It should be noted that similar reference numbers and letters should indicate similar items in the following figures, and therefore, once an item is defined in one figure, it is not required to be further discussed in the following figures.

Figure 1:
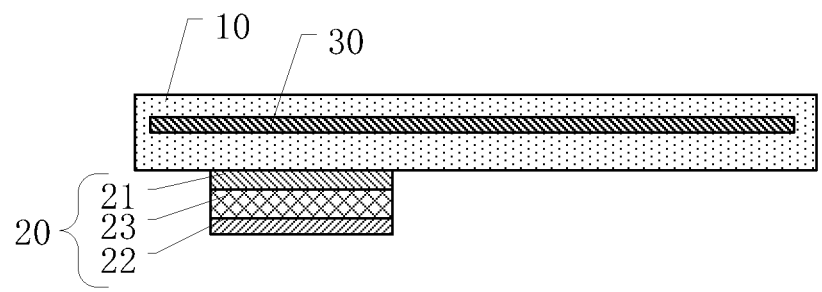
FIG. 1 illustrates a schematic cross-sectional view of an exemplary touch-control panel consistent with some embodiments of the present disclosure.

The present disclosure provides a touch-control panel. FIG. 1 illustrates a schematic cross-sectional view of an exemplary touch-control panel consistent with some embodiments of the present disclosure. Referring to FIG. 1, the touch-control panel may include a display panel 10 and at least one actuator 20. The display panel 10 may include a touch-control detection device 30, and the actuator 20 may include a first electrode 21, a second electrode 22, and an inductive layer 23 sandwiched between the first electrode 21 and the second electrode 22. When the touch-control detection device 30 detects a touch-control operation, the actuator 20 located in the region where the touch-control operation takes place may vibrate.

In one embodiment, the display panel 10 may be able to display image information. The display panel 10 may adopt liquid crystal display (LCD) technology, organic light-emitting display technology, electronic paper display technology, or any other appropriate display technology. The display technology adopted by the display panel 10 according to the embodiments of the present disclosure is not limited to any specific display technology.

The display panel 10 may be made of a flexible material, and thus may be a flexible display panel. When the actuator 20 vibrates, the actuator 20 may cause substantial deformation of the flexible display panel, which can be easily perceived by the user.

The display panel 10 may include a touch-control detection device 30, and the touch-control detection device 30 may be configured to detect the information of touch-control operations. It should be noted that the structure of the touch-control detection device 30 may have various forms. In the following, various examples will be provided to further illustrate the touch-control detection device 30.

Figure 2:
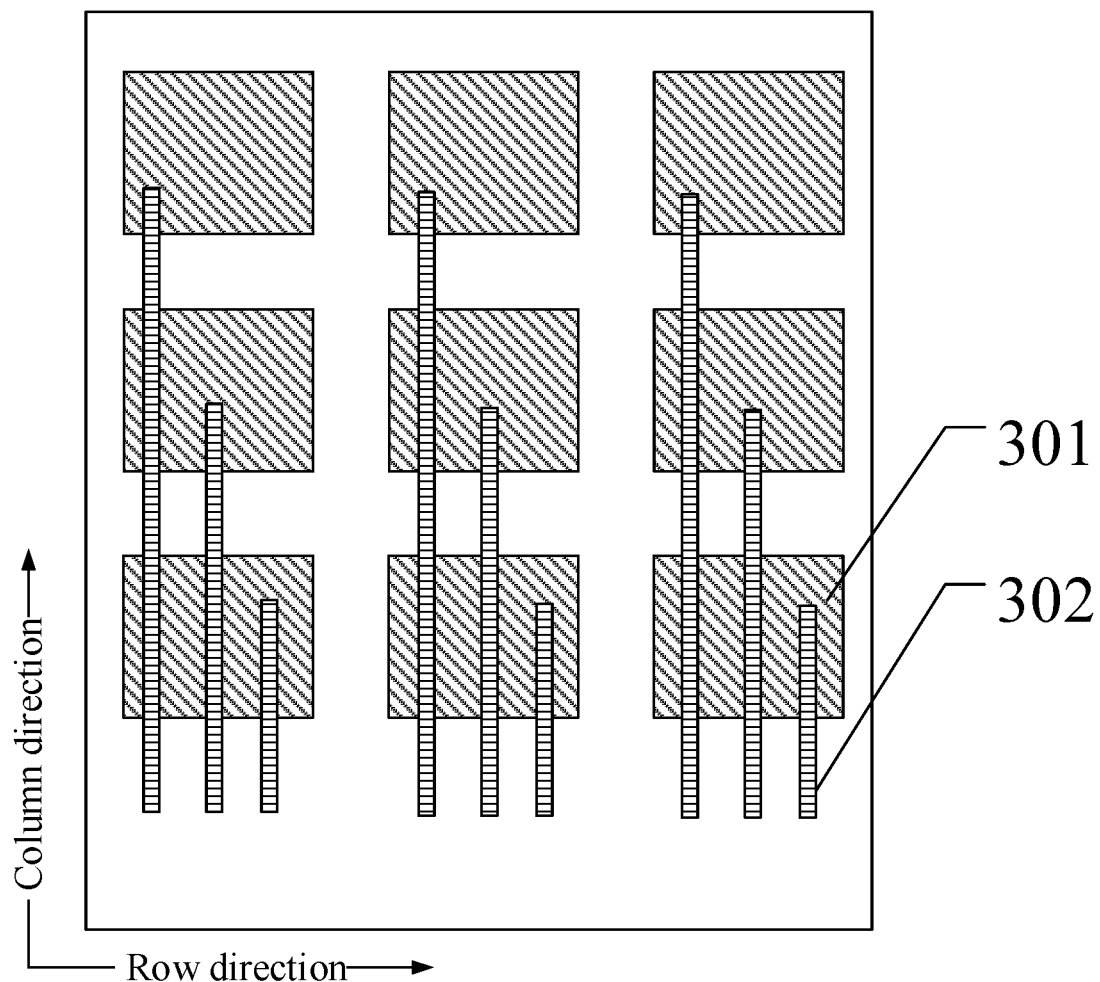
FIG. 2 illustrates a schematic planar view of a display panel in the touch-control panel shown in FIG. 1.

FIG. 2 illustrates a schematic planar view of a display panel in the touch-control panel shown in FIG. 1. Referring to FIGS. 1-2, the touch-control detection device in the display panel may be a self-capacitive type. For example, the touch-control detection device may include a plurality of touch-control electrode blocks 301. The plurality of touch-control electrode blocks 301 may be arranged in an array in a row direction and a column direction. Each touch-control electrode block 301 may be electrically connected to a touch-control electrode line 302.

When the display panel shown in FIG. 2 is used for touch-control detection, the touch-control electrode line 302 may send a touch-control signal to the touch-control electrode block 301. The touch-control electrode block 301 may receive the touch-control signal and form ground capacitance with the ground. The ground capacitance may serve as base capacitance for detecting touch-control operations. When the touch-control operation occurs on the display panel, the base capacitance of the touch-control electrode block 301 at the corresponding position may be changed. By calculating and analyzing the changes in the base capacitance of the plurality of touch-control electrode blocks 301, the position information of the touch-control operation can be obtained.

Figure 3:
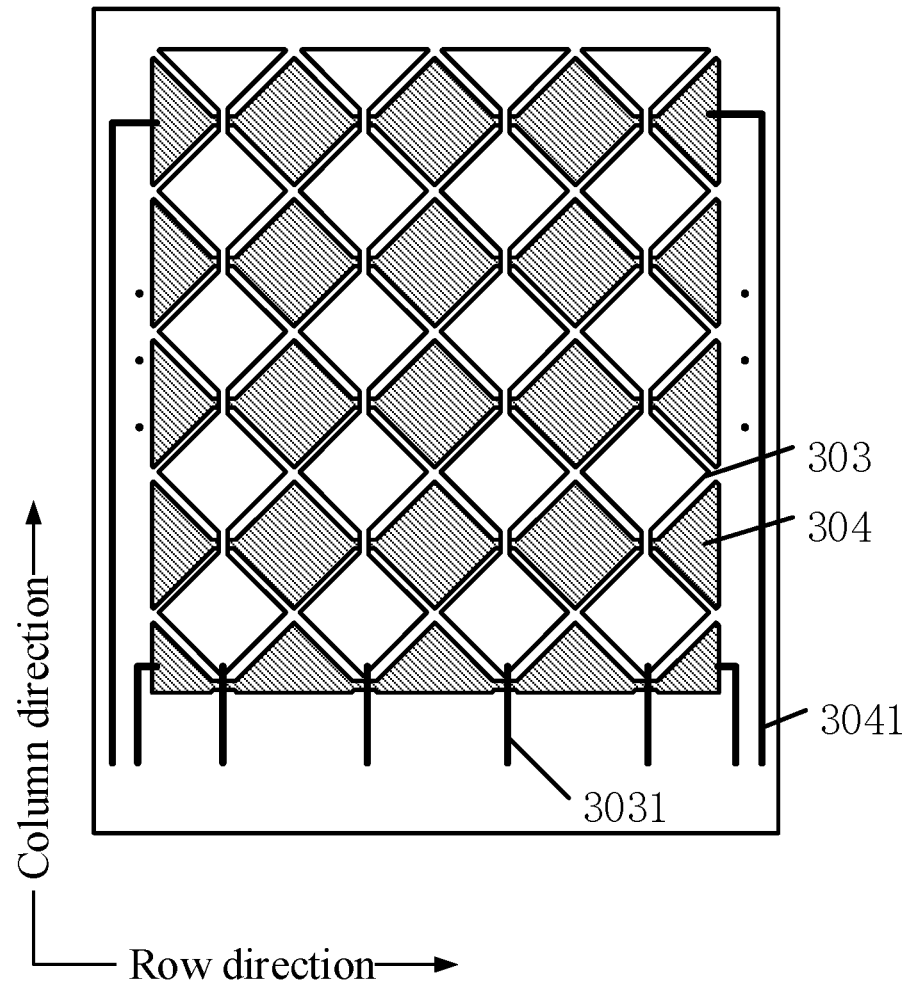
FIG. 3 illustrates a schematic planar view of another display panel in the touch-control panel shown in FIG. 1.

FIG. 3 illustrates a schematic planar view of another display panel in the touch-control panel shown in FIG. 1. Referring to FIGS. 1 and 3, the touch-control detection device in the display panel may be a mutual-capacitive type. For example, the touch-control detection device may include a plurality of touch-control emission electrodes 303, and a plurality of touch-control receiving electrodes 304. The plurality of touch-control emission electrodes 303 may extend in the column direction, and the plurality of touch-control emission electrodes 303 may be arranged along the row direction. The plurality of touch-control receiving electrodes 304 may extend in the row direction, and the plurality of touch-control receiving electrodes 304 may be arranged along the column direction. The plurality of touch-control emission electrodes 303 may be arranged across but electrically isolated from the plurality of touch-control receiving electrodes 304. The plurality of touch-control emission electrodes 303 may be electrically connected to a plurality of touch-control emission electrode lines 3031, and the plurality of touch-control receiving electrodes 304 may be electrically connected to a plurality of touch-control receiving electrode lines 3041.

When the display panel shown in FIG. 3 is used for touch-control detection, the touch-control emission electrode line 3031 may send a touch-control emission signal to a corresponding touch-control emission electrode 303, and the touch-control receiving electrode line 3041 may send a touch-control receiving signal to a corresponding touch-control receiving electrode 304. The touch-control emission electrode 303 and the touch-control receiving electrode 304 may together form mutual-inductive capacitance, and the mutual-inductive capacitance may serve as base capacitance for detecting touch-control operations. When the touch-control operation occurs on the display panel, the mutual-inductive capacitance between the touch-control emission electrode 303 and the touch-control receiving electrode 304 at the corresponding position may be changed. By calculating and analyzing the changes in the mutual-inductive capacitance between the plurality of touch-control emission electrodes 303 and the plurality of touch-control receiving electrodes 304, the position information of the touch-control operation can be obtained.

It should be noted that in the touch-control panel according to the embodiments of the present disclosure, the touch-control detection device may only need to detect the position information of touch-control operations. FIGS. 2-3 merely illustrate the structure and the operation principle of various exemplary touch-control detection devices 30. For those skilled in the art, it should be understood that the specific structure and operation principle of the touch-control detection device may have various forms. For example, the touch-control detection device may be a resistive type, or an inductive type. In the present disclosure, the touch-control detection device is not limited to any specific type.

In a touch-control panel according to the embodiments of the present disclosure, at least one actuator 20 may be disposed together with a first electrode 21 and a second electrode 22 used for receiving voltage signals for the actuator 20. When different voltage signals are applied to the first electrode 21 and the second electrode 22, respectively, the inductive layer 23 may undergo different degrees of deformation.

Figure 4:
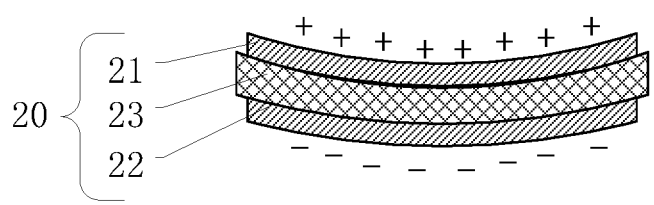
FIG. 4 illustrates a schematic view of a deformation structure of the actuator in the touch-control panel shown in FIG. 1.
Figure 5:
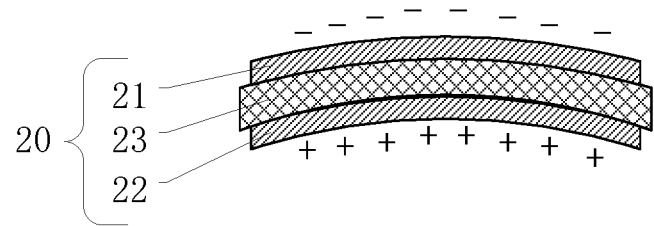
FIG. 5 illustrates a schematic view of another deformation structure of the actuator in the touch-control panel shown in FIG. 1.

FIGS. 4-5 illustrate schematic views of deformation structures of the actuator in the touch-control panel shown in FIG. 1. Referring to FIGS. 4-5, using the upper surface of the actuator as a front surface for illustration, when the voltage signal on the first electrode 21 is positive and the voltage signal on the second electrode 22 is negative, the inductive layer 23 may be concavely deformed; when the voltage signal on the first electrode 21 is negative and the voltage signal on the second electrode 22 is positive, the inductive layer 23 may be convexly deformed.

A first voltage state may be used to represent a scenario in which the voltage signal on the first electrode 21 is positive and the voltage signal on the second electrode 22 is negative, and a second voltage state may be used to represent another scenario in which the voltage signal on the first electrode 21 is negative and the voltage signal on the second electrode 22 is positive. When the switching frequency for alternating the first voltage state and the second voltage stage is high, the inductive layer 23 may accordingly generate concave and convex deformations alternating at a high frequency, leading to vibration of the actuator 20.

Further, by tuning the alternation frequency of the voltage signals of the first electrode 21 and/or the second electrode 22, the vibration frequency of the actuator 20 may be controlled, such that tactile feedback with a wide range of frequencies may be provided to the user.

Further, when the difference between the voltage signal of the first electrode 21 and the voltage signal of the second electrode 22 varies, the degree of deformation of the inductive layer 23 may also change. By controlling the difference between the voltage signal of the first electrode 21 and the voltage signal of the second electrode 22, the vibration amplitude of the actuator 20 may be controlled, such that tactile feedback with a wide range of amplitudes may be provided to the user.

The actuator 20 may have the advantages of simple structure, low vibration noise, fast response speed, and low power consumption. In addition, the volume of the actuator 20 can be either big or small. When the volume of the actuator 20 is set to be small with respect to the display panel 10, the vibration of the actuator 20 may lead to the vibration only in a local region of the display panel 10, and the vibration in other regions of the display panel 10 may be weak.

In one embodiment, when the user performs a touch-control operation on the touch-control panel, the touch-control detection device 30 may detect the touch-control operation and calculate the position of the touch-control operation. When the actuator 20 is disposed in the region where the touch-control operation occurs, the actuator 20 may vibrate to provide the user with tactile feedback.

In the touch-control panel shown in FIG. 1, only one actuator 20 is provided as an example for description. When a user performs a touch-control operation on the touch-control panel, the touch-control detection device 30 may be used for detecting the touch-control operation and also calculate and analyze the position of the touch-control operation. When the position of the touch-control operation occurs in the region where an actuator 20 is disposed, the actuator 20 may vibrate to provide the user with tactile feedback.

In other embodiments, the number of the actuators 20 included in the touch-control panel may be two or more. When the touch-control operation is performed on the touch-control panel, the touch-control detection device 30 may detect the touch-control operation and calculate the position of the touch-control operation. When the touch-control operation occurs at a specific region, the actuator 20 corresponding to the touch-control operation region may vibrate to provide tactile feedback to the user. In one embodiment of the present disclosure, the touch-control panel may include two or more actuators, and the vibration frequencies and/or the vibration amplitudes may be different for different actuators 20. Therefore, when the user touches different regions of the touch-control panel, the obtained tactile feedback may be different. When the user performs a blind operation on the touch-control panel, the position of the touch-control operation may be determined according to the corresponding tactile feedback.

In one embodiment, at least one actuator may be disposed in the touch-control panel. The actuator may have the advantages of simple structure, small vibration noise, fast response speed, low power consumption, etc. In addition, the actuator may be able to provide the user with rich tactile feedback. For example, the actuator may be able to provide different vibration frequencies and/or different vibration amplitudes. Further, when the user performs a blind operation on the touch-control panel, the position of the touch-control operation may be determined according to different tactile feedback, which may be conducive to improving the reliability of the blind operation.

In one embodiment, referring to FIG. 1, the first electrode 21 may be made of a material including at least one of the following materials: indium gallium zinc oxide (IGZO), indium zinc oxide (IZO), indium tin oxide (ITO), and indium gallium tin oxide (IGTO); and the second electrode 22 may be made of a material including at least one of the following materials: IGZO, IZO, ITO, and IGTO.

IGZO, IZO, ITO, and IGTO are all conductive materials with desired electrical conductivity. The charge mobility in these materials is high. In a film form, an oxide containing indium and zinc is transparent, and thus is a good material for electrode fabrication.

In one embodiment of the present disclosure, the inductive layer 23 may be made include at least one of the following: a polylactic acid piezoelectric film and a piezoelectric ceramic film.

Figure 6:
FIG. 6 illustrates a schematic cross-sectional view of another exemplary touch-control panel consistent with some embodiments of the present disclosure.
Figure 6:
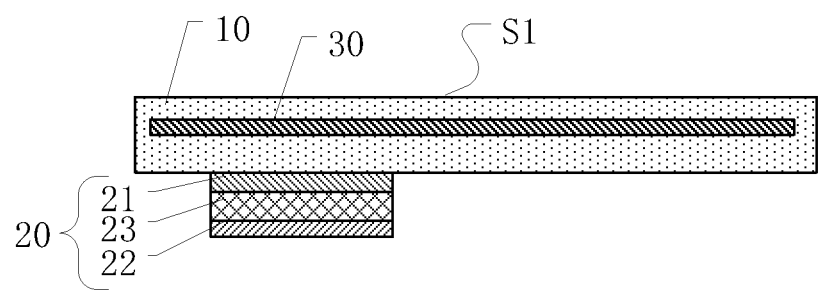

FIG. 6 illustrates a schematic cross-sectional view of another exemplary touch-control panel consistent with some embodiments of the present disclosure. Referring to FIG. 6, in one embodiment, the display panel 10 may have a light-emitting surface S1 and, opposite to the light-emitting surface S1, a back-side surface. The actuator 20 may be disposed on the back-side surface of the display panel 10 that is opposite to the light-emitting surface S1. The light-emitting surface S1 of the display panel 10 may be able to emit light, and the human eye EYE may observe the light-emitting surface S1 to obtain the image information displayed by the display panel 10.

Disposing the actuator 20 on the back-side surface of the display panel 10 that is opposite to the light-emitting surface S1 may be able to prevent the actuator 20 from blocking the outgoing light of the display panel 10, thereby preventing the actuator 20 from affecting the display quality of the display panel 10.

Figure 7:
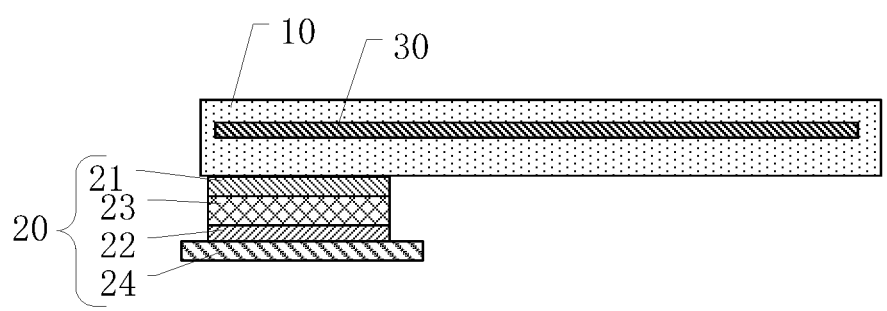
FIG. 7 illustrates a schematic cross-sectional view of another exemplary touch-control panel consistent with some embodiments of the present disclosure.
Figure 8:
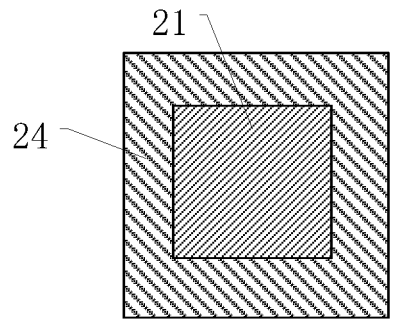
FIG. 8 illustrates a schematic planar view of an exemplary actuator in the touch-control panel shown in FIG. 7.

FIG. 7 illustrates a schematic cross-sectional view of another exemplary touch-control panel consistent with some embodiments of the present disclosure, and FIG. 8 illustrates a schematic planar view of an exemplary actuator in the touch-control panel shown in FIG. 7. Referring to FIGS. 7-8, in one embodiment of the present disclosure, the actuator 20 may further include a carrier substrate 24. The carrier substrate 24 may have a predetermined shape. The second electrode 22 may have a first surface adjacent to the display panel 10, and a second surface far away from the display panel 10. The first electrode 21 may be located at the first surface of the second electrode 22, and the carrier substrate 24 may be located at the second surface of the second electrode 22. The carrier substrate 24 is attached to the second electrode 22.

In one embodiment, the first electrode 21, the second electrode 22, and the inductive layer 23 sandwiched between the first electrode 21 and the second electrode 22 may be disposed on the carrier substrate 24. The carrier substrate 24 may be used to carry the first electrode 21, the second electrode 22, and the inductive layer 23. In addition, the carrier substrate 24 may have a large size. For example, the area size of the carrier substrate 24 may be larger than the area size of the second electrode 22.

When appropriate voltage signals are applied to the first electrode 21 and the second electrode 22, the inductive layer 23 may be deformed, and accordingly, the carrier substrate 24 may also be deformed. By alternately changing the voltage signals applied to the first electrode 21 and the second electrode 22, the carrier substrate 24 may be repeatedly deformed to generate vibration.

Figure 9:
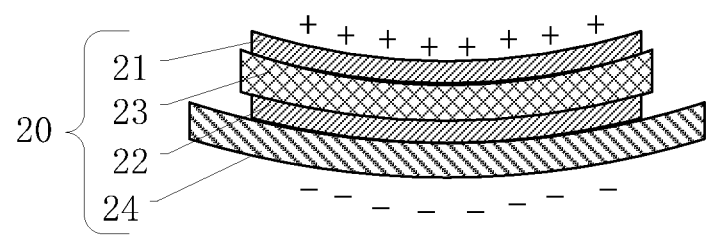
FIG. 9 illustrates a schematic view of a deformation structure of the actuator in the touch-control panel shown in FIG. 7.
Figure 10:
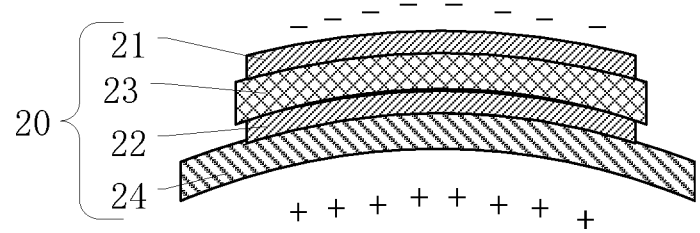
FIG. 10 illustrates a schematic view of another deformation structure of the actuator in the touch-control panel shown in FIG. 7.

FIG. 9 illustrates a schematic view of a deformation structure of the actuator in the touch-control panel shown in FIG. 7, and FIG. 10 illustrates a schematic view of another deformation structure of the actuator in the touch-control panel shown in FIG. 7. Referring to FIGS. 9-10, using the upper surface of the actuator as a front surface for illustration, when the voltage signal of the first electrode 21 is positive and the voltage signal of the second electrode 22 is negative, the inductive layer 23 may be concavely deformed, and accordingly, the carrier substrate 24 may also be concavely deformed; when the voltage signal of the first electrode 21 is negative and the voltage signal of the second electrode 22 is positive, the inductive layer 23 may be convexly deformed, and accordingly, the carrier substrate 24 may also be convexly deformed.

In one embodiment of the present disclosure, the hardness of the carrier substrate 24 may be larger than the hardness of the first electrode 21 and also larger than the hardness of the second electrode 22. Because the hardness of the carrier substrate 24 is large, the carrier substrate 24 may be able to improve the vibration of the inductive layer 23.

In one embodiment, the carrier substrate 24 may be made of a material including at least one of the following: epoxy and metal. Both epoxy and metal have desired bending properties, and can be bent repeatedly without breaking. Therefore, using an epoxy and/or a metal material to fabricate the carrier substrate 24, the carrier substrate 24 may have desired bending properties, and thus meet the operation requirements of the actuator 20.

Figure 11:
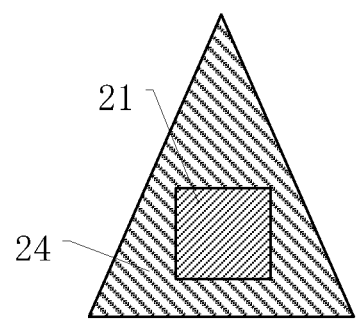
FIG. 11 illustrates a schematic planar view of another exemplary actuator in the touch-control panel shown in FIG. 7.
Figure 12:
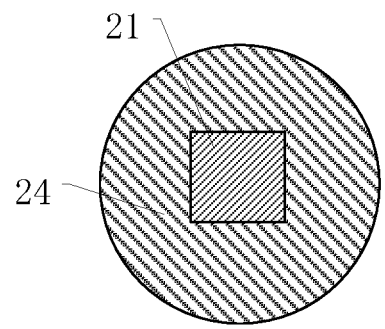
FIG. 12 illustrates a schematic planar view of another exemplary actuator in the touch-control panel shown in FIG. 7.
Figure 13:
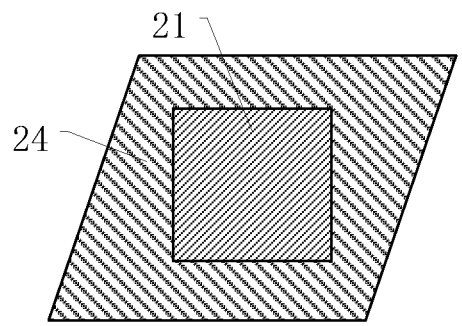
FIG. 13 illustrates a schematic planar view of another exemplary actuator in the touch-control panel shown in FIG. 7.

It should be noted that the carrier substrate 24 may have a predetermined shape. In the embodiments of the present disclosure, the shape of the carrier substrate 24 refers to the shape of the orthogonal projection of the carrier substrate 24 on the display panel 10. Referring to FIG. 8, for illustrative purposes, the carrier substrate 24 is described to have, for example, a rectangular shape. In other embodiments, the carrier substrate 24 may have various shapes. For example, FIGS. 11-13 illustrate schematic planar views of various exemplary actuators that have shapes different from a rectangle. Referring to FIG. 11, the shape of the carrier substrate 24 may be a triangle; referring to FIG. 12, the shape of the carrier substrate 24 may be a circle; and referring to FIG. 13, the shape of the carrier substrate 24 may be a parallelogram.

Figure 14:
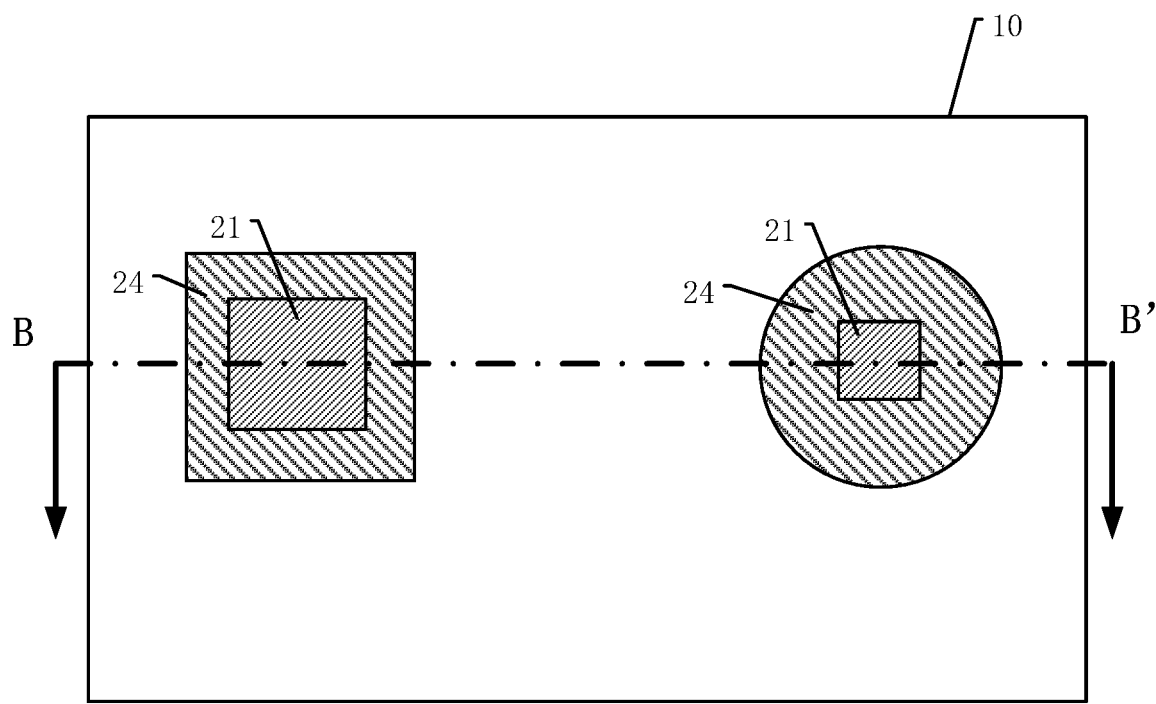
FIG. 14 illustrates a schematic planar view of another exemplary touch-control panel consistent with some embodiments of the present disclosure.
Figure 15:
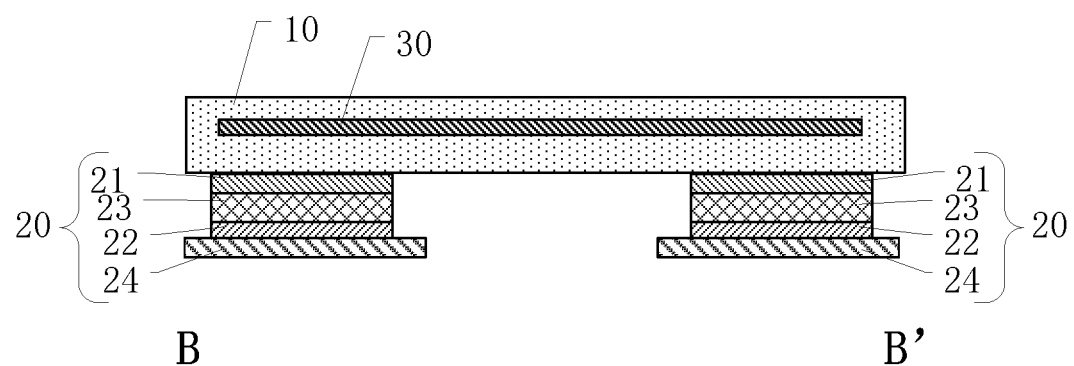
FIG. 15 illustrates a schematic cross-sectional view of the structure shown in FIG. 14 along a BB' line.

FIG. 14 illustrates a schematic planar view of another exemplary touch-control panel consistent with some embodiments of the present disclosure, and FIG. 15 illustrates a schematic cross-sectional view of the structure shown in FIG. 14 along a BB' line. Referring to FIGS. 14-15, in one embodiment, the touch-control panel may include at least two actuators 20. The carrier substrates corresponding to the at least two actuators 20 may have different shapes. For example, the touch-control panel shown in FIG. 14 may include two actuators 20, and the shapes of the carrier substrates corresponding to the two actuators 20 may be rectangular and circular, respectively. In other embodiments, the touch-control panel may include a plurality of actuators 20, and the shapes of the carrier substrates corresponding to the plurality of actuators 20 may be different from each other.

It should be noted that in order to clearly illustrate the technical schemes of the embodiments of the present disclosure, the display panel 10 shown in FIG. 14 is merely represented by a wire frame without including any filling patterns, and the touch-control detection device of the display panel 10 is not shown in FIG. 14.

Figure 16:
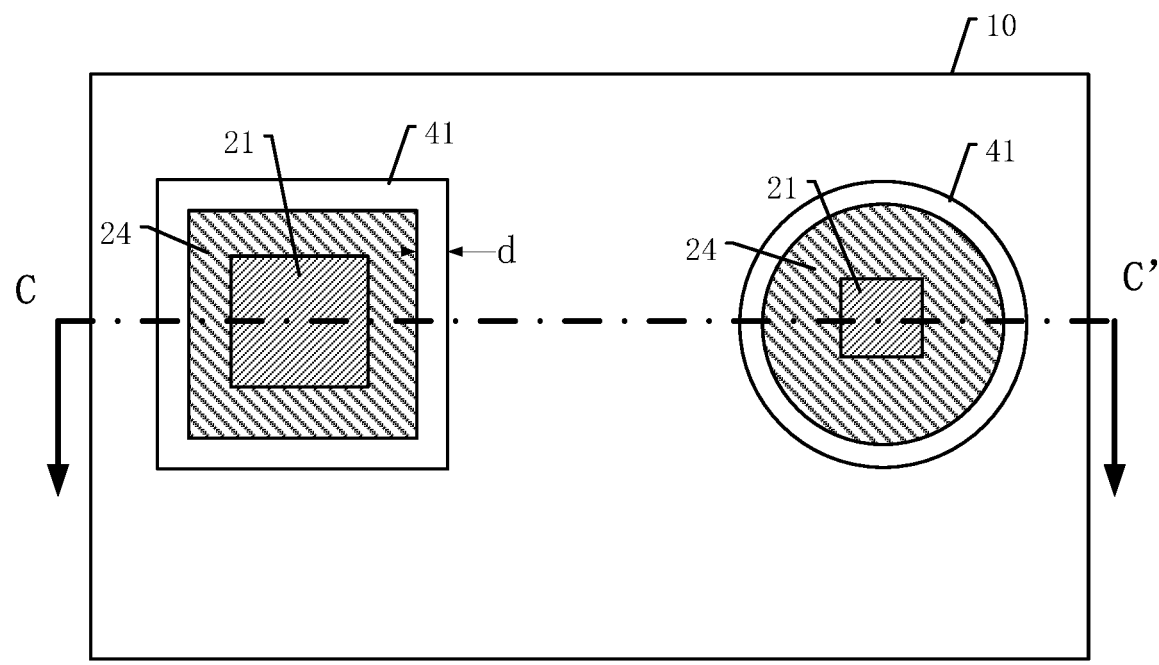
FIG. 16 illustrates a schematic planar view of another exemplary touch-control panel consistent with some embodiments of the present disclosure.
Figure 17:
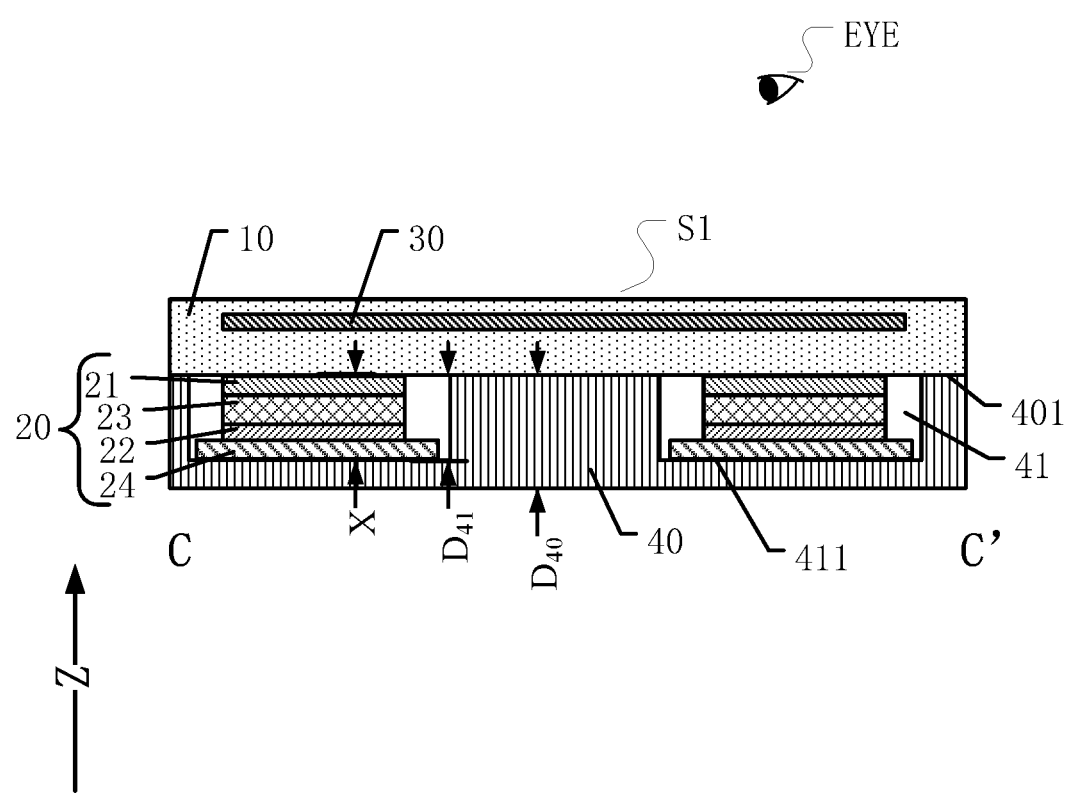
FIG. 17 illustrates a schematic cross-sectional view of the structure shown in FIG. 16 along a CC' line.

FIG. 16 illustrates a schematic planar view of another exemplary touch-control panel consistent with some embodiments of the present disclosure, and FIG. 17 illustrates a schematic cross-sectional view of the structure shown in FIG. 16 along a CC' line. Referring to FIGS. 16-17, in one embodiment of the present disclosure, the touch-control panel may include a first support plate 40. The display panel 10 may have a light-emitting surface S1 and an opposite surface, opposing the light-emitting surface S1. The first support plate 40 may be disposed on the back-side surface of the display panel 10 that is opposite to the light-emitting surface S1. The first support plate 40 may include at least one trench 41, and each trench 41 may include an opening facing the display panel 10, and an actuator 20 may be disposed in the trench 41.

In one embodiment, a plurality of trenches 41 may be formed in the first support plate 40. The plurality of trenches 41 may be used for containing a plurality of actuators 20. During the fabrication process of the touch-control panel, the actuator 20 may be disposed into a corresponding trench 41, and then the first support plate 40 containing the plurality of actuators 20 may be assembled together with the display panel 10, such that the manufacturing process and the structure of the display panel 10 may not need to be changed. As such, the fabrication process of the touch-control panel may be simple and efficient. In addition, the first support plate 40 may be able to fill the space between the actuators 20, such that the first support plate 40 and the plurality of actuators 20 may, as a whole, form a relatively flat structure to support the display panel 10. As such, the shape of the display panel 10 may not be affected, and the display quality may not be degraded due to an uneven surface under the display panel 10.

It should be noted that, in order to clearly illustrate the technical schemes of the embodiments of the present disclosure, the display panel 10 shown in FIG. 16 is merely represented by a wire frame without including any filling patterns, and the touch-control detection device of the display panel 10 is not shown in FIG. 16.

In one embodiment, the first support plate 40 may be made of a material including one of the following: epoxy and metal. Both epoxy and metal have desired bending properties, and can withstand the vibration of the actuator 20 and avoid any failure such as cracking, etc.

In one embodiment, a thickness D40 of the first support plate 40 may be larger than the depth D41 of each trench 41, and the depth D41 of the trench 41 may be larger than or equal to the thickness X of the corresponding actuator 20. In a direction Z perpendicular to the first support plate 40, when the actuator 20 is not vibrating, the actuator 20 may not exceed the surface 401 of the first support plate 40 that faces to the display panel 10. In one embodiment, the thickness D40 of the first support plate 40 may need to be larger than the depth D41 of the trench 41 because when the thickness D40 of the first support plate 40 is equal to or smaller than the depth D41 of the trench 41, the trench 41 may not be possibly formed. The depth D41 of the trench 41 may need to be larger than or equal to the thickness X of the corresponding actuator 20 such that the trench 41 may be able to contain the actuator 20, and the actuator 20 may not exceed the surface 401 of the first support plate 40. When the actuator 20 exceeds the surface 401 of the first support plate 40, the process of attaching the first support plate 40 to the display panel 10 may be more difficult. Therefore, the production cost of the touch-control panel may increase and the manufacturing efficiency may decrease. Moreover, when the actuator 20 exceeds the surface 401 of the first support plate 40, because of the support of the actuator 20 (when the actuator 20 is not vibrating), the touch-control panel 10 disposed on the first support plate 40 may form an uneven shape, affecting the display quality.

In one embodiment, the thickness X of the actuator 20 in the direction perpendicular to the plane of the display panel 10 may satisfy 0.3 mm≤X≤0.4 mm. That is, the thickness of the actuator 20 may be in a range between approximately 0.3 mm and 0.4 mm. The thickness of the actuator 20 may not be too small. For example, when the thickness of the actuator 20 is smaller than 0.3 mm, the film layers of the actuator 20 may be reduced accordingly, and thus the requirements on the manufacturing process may be high. Therefore, the fabrication of the actuator 20 may be more difficult, leading to an increase in the production cost of the actuator 20 and a decrease in the manufacturing efficiency of the actuator 20. The thickness of the actuator 20 may not be too large either. When the thickness of the actuator 20 is larger than 0.4 mm, the thickness of the first support plate 40 may be increased accordingly. As such, the overall thickness of the touch-control panel may be increased, which may not be conducive to making the touch-control panel thinner and lighter.

In one embodiment of the present disclosure, the area size S of the actuator 20 in a direction parallel to the plane of the display panel 10 may satisfy 100 mm$^2$≤S≤10000 mm$^2$. That is, the area size S of the actuator 20 in the direction parallel to the plane of the display panel 10 may be in a range between approximately 100 mm$^2$ and 10000 mm$^2$. The area size S of the actuator 20 in the direction parallel to the plane of the display panel 10 can be understood as the area size of the orthogonal projection of the actuator 20 on the plane of the display panel 10. Having the area size of the orthogonal projection of the actuator 20 on the plane of the display panel 10 in the range of approximately 100 mm$^2$ to 10000 mm$^2$ may ensure that when a user uses a finger to perceive the tactile feedback, the finger is able to cover the region of the actuator 20. Therefore, the shape information of the actuator 20 can be easily obtained, and thus blind operations may be more convenient. The area size of the actuator 20 may not be too small. For example, when the area size of the actuator 20 is smaller than 100 mm$^2$, the vibration of the actuator 20 may be too weak to be easily perceived by the user. The area size of the actuator 20 may not be too large either. For example, when the area size of the actuator 20 is larger than 10000 mm$^2$, the space occupied by the actuator 20 may be too large to allow a plurality of actuators 20 to be integrated into the touch-control panel. In addition, when the area size of the actuator 20 is too large, the voltage signals applied to the first electrode 21 and the second electrode 22 may need to be large in order to drive the actuator 20, and thus the power consumption of the touch-control panel may also be large.

Further, in one embodiment, referring to FIGS. 16-17, the actuator 20 may also include a carrier substrate 24. The carrier substrate 24 may have a pre-determined shape. The second electrode 22 may have a first surface adjacent to the display panel 10, and a second surface far away from the display panel 10. The first electrode 21 may be located at the first surface of the second electrode 22 that faces to the display panel 10, the carrier substrate 24 may be located at the second surface of the second electrode 22 that faces away from the display panel 10, and the carrier substrate 24 and the second electrode 22 may be attached together. The shape of the trench 41 may be the same as the shape of the carrier substrate 24.

In one embodiment, the carrier substrate 24 may have any appropriate shape including rectangle, circle, triangle, parallelogram, etc. The shape of the trench 41 may be the same as the shape of the corresponding carrier substrate 24. The shape of the trench 41 may refer to the shape of the bottom surface 411 of the trench 41. Therefore, the trench 41 may also have any appropriate shape, including rectangle, circle, triangle, parallelogram, etc.

In one embodiment, the shape of the trench 41 is set to be the same as the shape of the carrier substrate 24 so that the trench 41 may be adapted to the shape of the carrier substrate 24. In addition, in one embodiment of the present disclosure, the display panel 10 may be made of a flexible material, and thus the display panel 10 may be a flexible display panel. When a user touches the touch-control panel, for example, when a user presses down the display panel, the trench 41 formed in the first support plate 40 may be perceived by the user, which may help the user determine whether the touched position corresponds to the actuator 20.

In one embodiment of the present disclosure, a distance d from the edge of a trench 41 to the edge of the carrier substrate 24 of the corresponding actuator 20 disposed in the trench 41 may satisfy 5 mm≤d≤10 mm. That is, a gap between the edge of the trench 41 and the edge of the carrier substrate 24 may have a dimension in a range between approximately 5 mm and 10 mm. When the gap between the edge of the trench 41 and the edge of the carrier substrate 24 ranges approximately from 5 mm to 10 mm, the gap may be able to allow the user to perceive the edge of the trench 41 and the shape of the trench 41 more easily.

Figure 18:
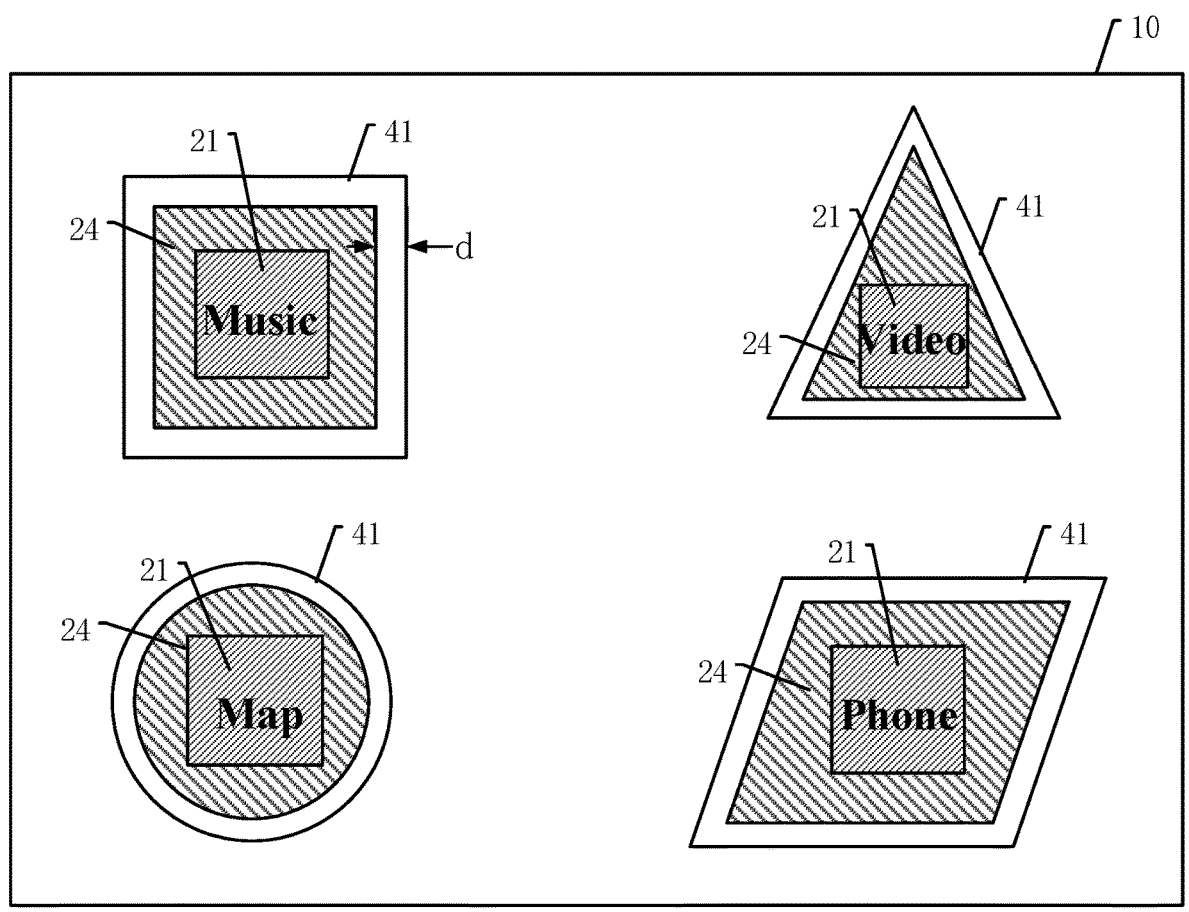
FIG. 18 illustrates a schematic planar view of another exemplary touch-control panel consistent with some embodiments of the present disclosure.

Because the plurality of trenches 41 may have various shapes, the user may be able to determine the position touched (i.e. the position where the touch-control operation takes place) according to the perceived shapes of the trenches 41. FIG. 18 illustrates a schematic planar view of another exemplary touch-control panel consistent with some embodiments of the present disclosure. Referring to FIG. 18, in one embodiment, the touch-control panel may include four actuators 20, and the actuator 20 may be disposed in a corresponding trench 41. The shapes of the four actuators 20 may be rectangle, circle, triangle, and parallelogram, respectively.

The regions of the display panel 10 corresponding to the four actuators may have different functions. For example, the region of the display panel 10 that corresponds to the rectangular actuator 20 may have a 'Music' function, the region of the display panel 10 that corresponds to the triangular actuator 20 may have a 'Video' function, the region of the display panel 10 that corresponds to the circular actuator 20 may have a 'Map' function, and the region of the display panel 10 that corresponds to the parallelogram-shaped actuator 20 may have a 'Phone' function. When a user performs a blind operation to execute the 'Music' function, the user may search for the rectangular trench 41 by touching the display panel 10. Further, when the user perceives that the trench 41 touched has a rectangular shape, the user may press the display panel 10 to execute the 'Music' function. In the meantime, the actuator 20 may vibrate to provide tactile feedback indicating the operation is valid.

It should be noted that in order to clearly illustrate the technical schemes of the embodiments of the present disclosure, the display panel 10 shown in FIG. 18 is merely represented by a wire frame without including any filling patterns, and the touch-control detection device of the display panel 10 is not shown in FIG. 18.

Figure 19:
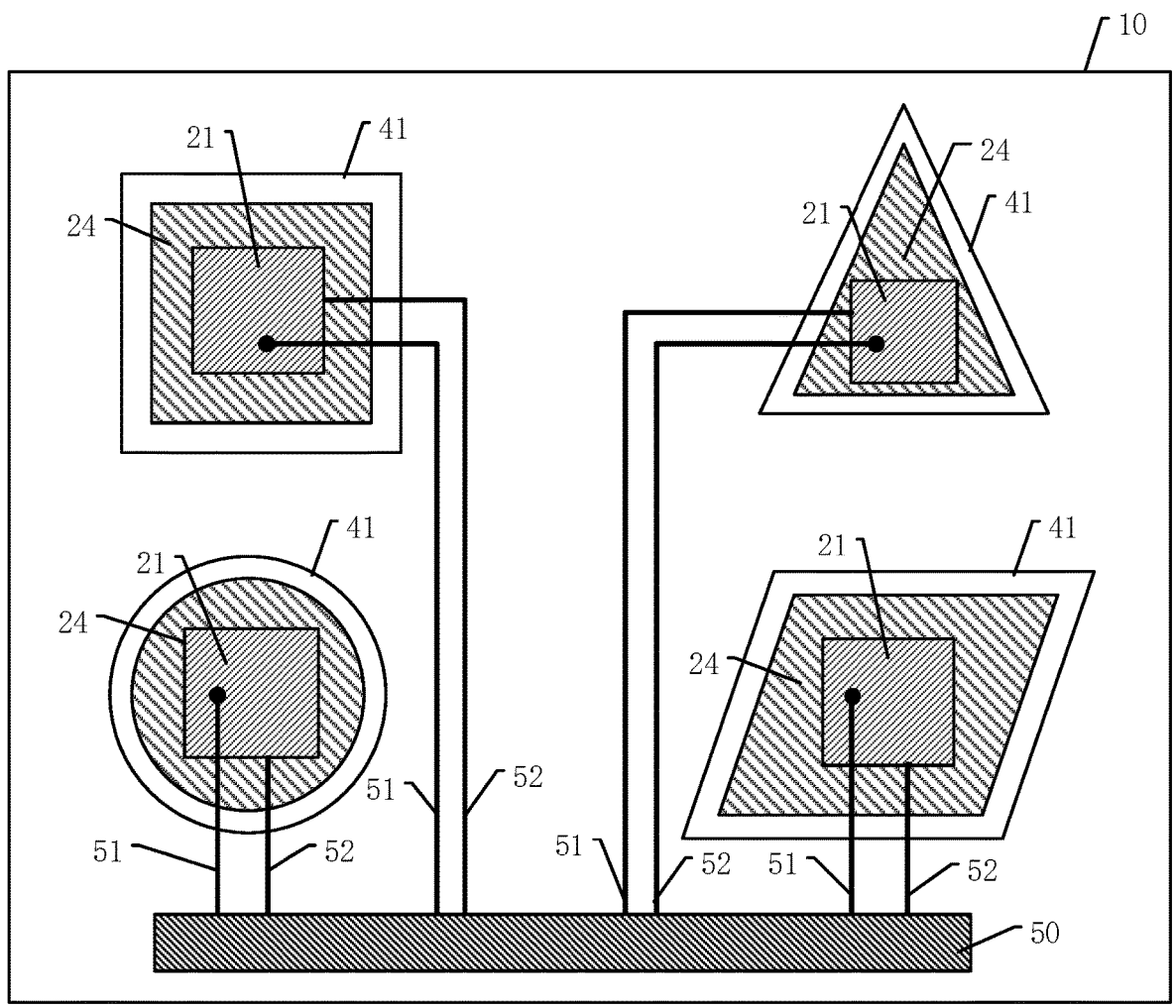
FIG. 19 illustrates a schematic planar view of another exemplary touch-control panel consistent with some embodiments of the present disclosure.

FIG. 19 illustrates a schematic planar view of another exemplary touch-control panel consistent with some embodiments of the present disclosure. Referring to FIGS. 1 and 19, in one embodiment, the touch-control panel may include a signal processing unit 50, a plurality of first signal lines 51, and a plurality of second signal lines 52. A terminal of each first signal line 51 may be electrically connected to a corresponding first electrode 21, and the other terminal of the first signal line 51 may be electrically connected to the signal processing unit 50. A terminal of each second signal line 52 may be electrically connected to a corresponding second electrode 22, and the other terminal of the second signal line 52 may be electrically connected to the signal processing unit 50.

In one embodiment, the signal processing unit 50 may be an integrated circuit chip disposed in the touch-control panel. The signal processing unit 50 may be used to process the electrical signal of the actuator 20. For example, the signal processing unit 50 may send electrical signals to the first electrode 21 through a corresponding first signal line 51, and send electrical signals to the second electrode 22 through a corresponding second signal line 52. As such the signal processing unit 50 may be able to control the voltage signals sent through the first signal line 51 and the second signal line 52, and thus control the vibration frequency and/or amplitude of the actuator 20.

In one embodiment, the first signal line 51 may transmit a first pulsed signal to the first electrode 21, and the second signal line 52 may transmit a second pulsed signal to the second electrode 22, such that the actuator 20 may have a first state and a second state that are alternately performed. In the first state, the voltage potential of the first electrode 21 may have a first polarity, and the voltage potential of the second electrode 22 may have a second polarity; in the second state, the voltage potential of the first electrode 21 may have the second polarity, and the voltage potential of the second electrode 22 may have the first polarity. The first polarity and the second polarity may be opposite to each other. For example, when the first polarity is the positive polarity, the second polarity is the negative polarity, and when the first polarity is the negative polarity, the second polarity is the positive polarity. In one embodiment, referring to FIG. 9, the actuator 20 may be in the first state with the voltage potential of the first electrode 21 positive and the voltage potential of the second electrode negative. In another embodiment, referring to FIG. 10, the actuator 20 may be in the second state with the voltage potential of the first electrode 21 negative and the voltage potential of the second electrode positive.

In one embodiment, by controlling the frequencies of the first pulsed signal and the second pulsed signal, the frequency for alternating the first state and the second state of the actuator 20 may be controlled. The higher the frequency of the alternation of the first state and the second state, the higher the frequency at which the actuator 20 vibrates; the lower the frequency of the alternation of the first state and the second state, the lower the frequency at which the actuator 20 vibrates. In addition, at a certain moment, the larger the difference in the voltage potential between the first pulsed signal and the second pulsed signal, the larger the vibration amplitude of the actuator 20; the smaller the difference in the voltage potential between the first pulsed signal and the second pulsed signal, the smaller the vibration amplitude of the actuator 20.

The signal processing unit 50 may be able to provide same first pulsed signals and same second pulsed signals to different actuators 20, and as such, the vibration frequencies of different actuators 20 may be the same. The signal processing unit may also be able to provide different first pulsed signals and/or different second pulsed signals to different actuators 20, and as such, the vibration frequencies of different actuators 20 may be different. Similarly, the signal processing unit 50 may be able to control the vibration amplitudes of different actuators 20 to be the same or be different such that more rich tactile feedback may be provided to the user.

Figure 20:
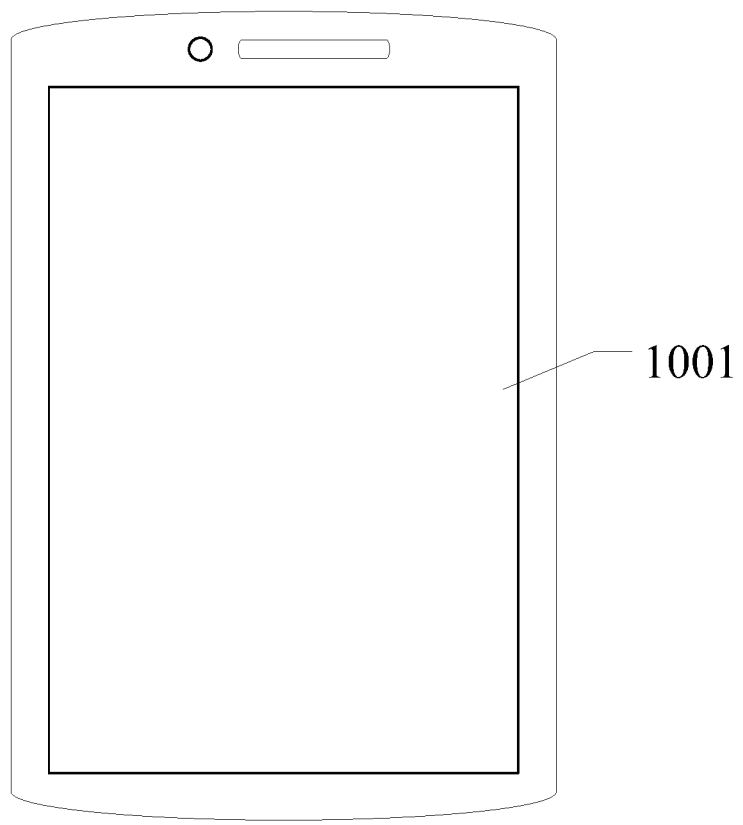
FIG. 20 illustrates a schematic structural view of an exemplary touch-control device consistent with some embodiments of the present disclosure.

The present disclosure also provides a touch-control device. The touch-control device may include a touch-control panel consistent with various embodiments of the present disclosure. FIG. 20 illustrates a schematic structural view of an exemplary touch-control device consistent with some embodiments of the present disclosure. Referring to FIG. 20, the touch-control device 1000 may include a touch-control panel 1001 consistent with the embodiments of the disclosed touch-control panel. As shown in FIG. 20, a mobile phone is provided as an example to illustrate the touch-control device 1000. It should be understood that in other embodiments, the disclosed touch-control device may be other devices with touch-control functions such as computer, television, in-car touch-control device, etc. The touch-control device provided by the embodiments of the present disclosure may have the advantages of the touch-control panel provided by the embodiments of the present disclosure. For the details of the touch-control device, reference should be made to the detailed description of the touch-control panel in the embodiments provided above.

Figure 21:
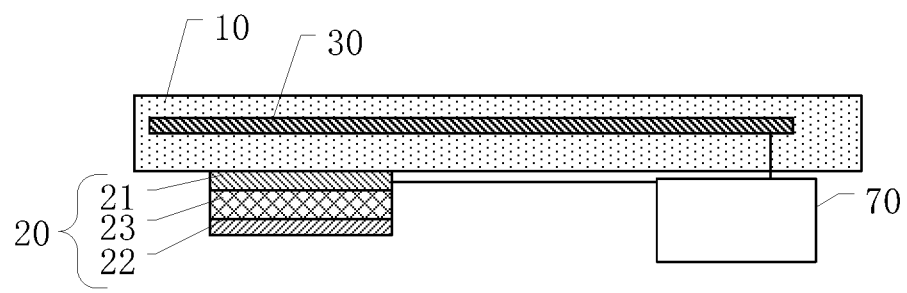
FIG. 21 illustrates a schematic cross-sectional view of a touch-control panel according to an exemplary driving method consistent with some embodiments of the present disclosure.

The present disclosure further provides a driving method for a touch-control panel. FIG. 21 illustrates a schematic cross-sectional view of a touch-control panel according to an exemplary driving method consistent with some embodiments of the present disclosure. Referring to FIG. 21, the driving method may be applied to a touch-control panel consistent with various embodiments of the present disclosure. The touch-control panel may include a display panel 10, at least one actuator 20, and a central processing module 70 (e.g. a central processing unit). The display panel 10 may include a touch-control detection device 30. The actuator 20 may include a first electrode 21, a second electrode 22, and an inductive layer 23 sandwiched between the first electrode 21 and the second electrode 22. The touch-control detection device 30 may be connected to the central processing module 70, and the actuator 20 may also be connected to the central processing unit 70.

The driving method may include, in response to the touch-control detection device 30 detecting a touch-control operation, receiving the position information of the touch-control operation by the central processing module 70, and controlling the actuator 20 in region where the touch-control operation occurs to vibrate.

According to the disclosed driving method, the display panel 10 may include a touch-control detection device 30, and the touch-control detection device 30 may be configured to detect information of touch-control operations. It should be noted that the structure of the touch-control detection device 30 may have various forms, and the embodiments of the present disclosure may not limit structure of the touch-control detection device 30 to any specific form.

When the touch-control detection device 30 detects that a user is performing a touch-control operation on the touch-control panel, the touch-control detection device 30 may detect the touch-control operation, and then calculate and analyze the position of the touch-control operation. Further, the touch-control detection device 30 may send the information of the touch-control operation to the central processing module 70, and the central processing module 70 may control the actuator 20 located in the region where the touch-control operation occurs to vibrate, and thus tactile feedback may be provided to the user.

Figure 22:
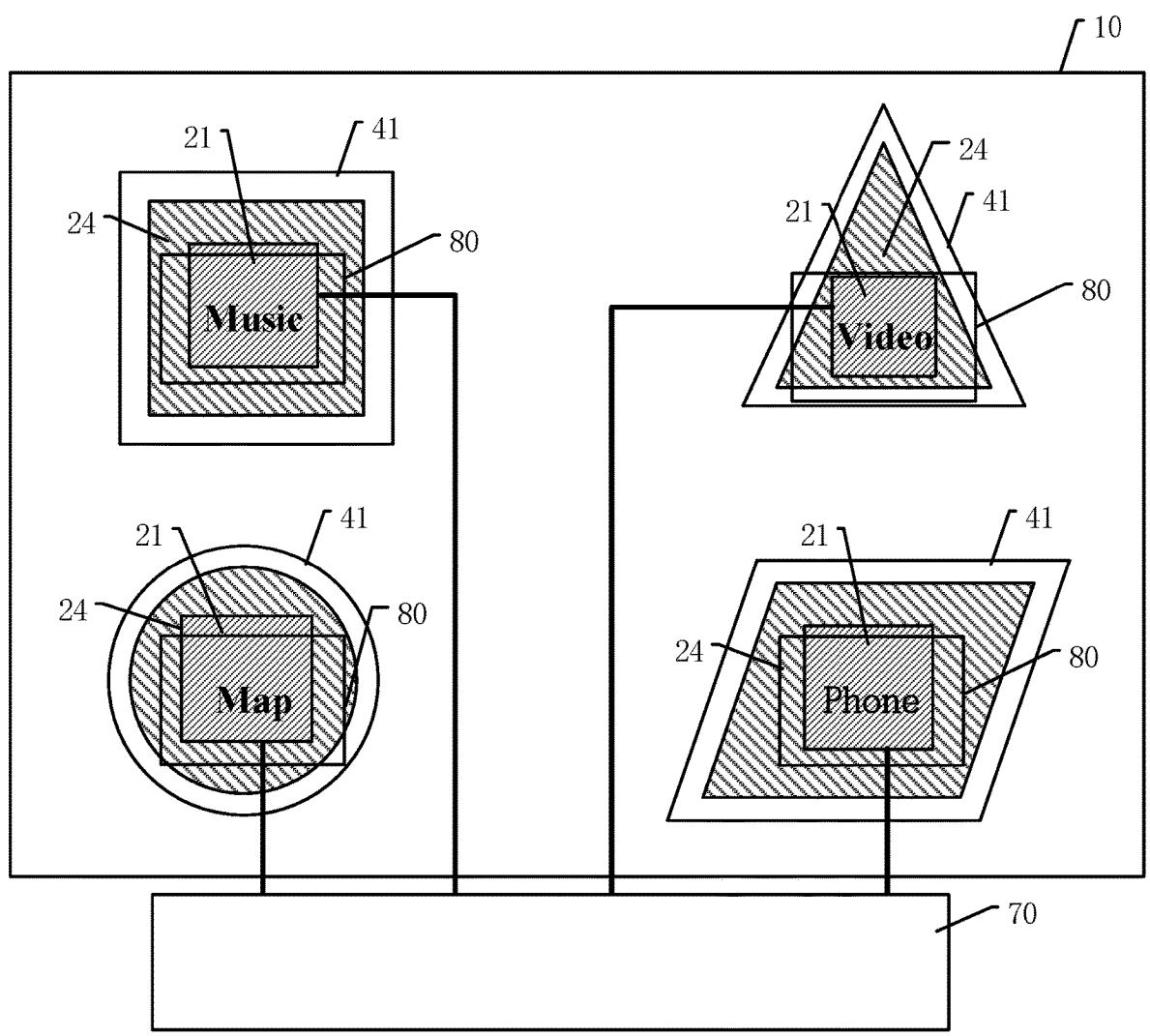
FIG. 22 illustrates a schematic planar view of a touch-control panel according to another exemplary driving method consistent with some embodiments of the present disclosure.

FIG. 22 illustrates a schematic planar view of a touch-control panel according to another exemplary driving method consistent with some embodiments of the present disclosure. Referring to FIGS. 21-22, in one embodiment, the display panel 10 may display a function icon 80, and in a direction perpendicular to the display panel 10, the function icon 80 and the actuator 20 may overlap with each other.

When the touch-control detection device 30 detects that the touch-control operation occurs in the region where the function icon 80 is located, the central processing module 70 may receive the position information of the touch-control operation, and control the actuator 20 located in the touch-control operation region to vibrate. The touch-control panel may perform the function corresponding to the function icon 80 on which the touch-control operation is performed.

For example, the function icon may be 'Music', 'Video', 'Map', or 'Phone'. In one embodiment, the function icon 80 may correspond to other functions.

When a user wants to listen music, the touch-control detection device 30 may detect that the user touches the 'Music' function icon and send the information of the touch-control operation to the central processing module 70; the central processing module 70 may receive the position information of the touch-control operation and control the actuator 20 located under the 'Music' function icon 80 to vibrate to provide the user with tactile feedback; and the touch-control panel may execute the music playing function corresponding to the 'Music' function icon 80.

As illustrated though the embodiments provided above, the disclosed touch-control panel and driving method, and the disclosed touch-control device may have the following advantages.

According to the disclosed touch-control panel and driving method, and the disclosed touch-control device, at least one actuator may be disposed in the touch-control panel. The actuator may have advantages of simple structure, low vibration noise, fast response speed, low power consumption, etc. In addition, the actuator can provide the user rich tactile feedback. For example, the actuator may be able to provide different vibration frequencies and/or different vibration amplitudes to improve user experience. Moreover, when a user performs a blind operation on the touch-control panel, the position of the touch-control operation can be determined according to different tactile feedback, which may be conducive to improving the reliability of the blind operation and thus further improve the user experience.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A touch-control panel, comprising:
   a display panel, a first support plate, and at least one actuator, wherein:
   the display panel includes a touch-control detection device;
   the at least one actuator is disposed on a side of the display panel away from a light-emitting surface, and each actuator of the at least one actuator includes a first electrode, a second electrode, and an inductive layer sandwiched between the first electrode and the second electrode, wherein the first electrode is located on a side of the second electrode adjacent to the display panel;

the each actuator further includes a carrier substrate disposed on a surface of the second electrode away from the display panel;

the first support plate includes at least one trench, and the at least one actuator is disposed in the at least one trench;

for the at least one trench and the at least one actuator disposed in the at least one trench, in a direction parallel to a plane of the display panel, a distance between an edge of the carrier substrate and an edge of the at least one trench is less than a distance between an edge of the second electrode and the edge of the at least one trench; and in response to the touch-control detection device detecting a touch-control operation, an actuator of the at least one actuator located in a region where the touch-control operation is performed vibrates.

2. The touch-control panel according to claim 1, wherein:
the carrier substrate has a predetermined shape; and
the carrier substrate is attached to the second electrode.

3. The touch-control panel according to claim 2, wherein the at least one actuator includes at least two actuators, wherein:
carrier substrates of the at least two actuators have different shapes.

4. The touch-control panel according to claim 2, wherein:
a hardness of the carrier substrate is larger than a hardness of the first electrode; and
the hardness of the carrier substrate is larger than a hardness of the second electrode.

5. The touch-control panel according to claim 2, wherein:
the carrier substrate is made of a material including at least one of an epoxy or a metal.

6. The touch-control panel according to claim 1, wherein:
the first support plate is disposed on a surface of the display panel opposite to the light-emitting surface; and
an opening of each trench faces the display panel.

7. The touch-control panel according to claim 6, wherein:
the carrier substrate has a predetermined shape;
the carrier substrate is attached to the second electrode; and
a shape of the trench is same as the predetermined shape of the carrier substrate.

8. The touch-control panel according to claim 7, wherein:
a distance between an edge of the trench and an edge of the carrier substrate of the each actuator disposed in the trench is in a range between approximately 5 mm and 10 mm.

9. The touch-control panel according to claim 6, wherein:
the first support plate is made of a material including one of an epoxy and a metal.

10. The touch-control panel according to claim 6, wherein:
a thickness of the first support plate is larger than a depth of the trench;
the depth of the trench is larger than or equal to a thickness of a corresponding actuator; and
in a direction perpendicular to the first support plate, the corresponding actuator in the trench of the first support plate is below or leveled with a surface of the first support plate that faces the display panel when the corresponding actuator is not vibrating.

11. The touch-control panel according to claim 1, wherein:

the first electrode is made of a material including at least one of indium gallium zinc oxide (IGZO), indium zinc oxide (IZO), indium tin oxide (ITO), or indium gallium tin oxide (IGTO);

the second electrode is made of a material including at least one of IGZO, IZO, ITO, or IGTO; and the inductive layer includes at least one of a polylactic acid piezoelectric film or a piezoelectric ceramic film.

12. The touch-control panel according to claim 1, further including:
a signal processing unit, a plurality of first signal lines, and a plurality of second signal lines, wherein:
a terminal of each first signal line is electrically connected to the first electrode, and another terminal of the each first signal line is electrically connected to the signal processing unit; and
a terminal of each second signal line is electrically connected to a second electrode, and another terminal of the each second signal line is electrically connected to the signal processing unit.

13. The touch-control panel according to claim 12, wherein:
the each actuator has a first state and a second state alternately performed by transmitting a first pulsed signal to the first electrode of the each actuator through a corresponding first signal line and transmitting a second pulsed signal to the second electrode of the each actuator through a corresponding second signal line, wherein:
in the first state, a voltage potential of the first electrode has a first polarity and a voltage potential of the second electrode has a second polarity; and
in the second state, the voltage potential of the first electrode has the second polarity and the voltage potential of the second electrode has the first polarity, wherein:
the first polarity and the second polarity are opposite to each other.

14. The touch-control panel according to claim 1, wherein:
a thickness of the each actuator in a direction perpendicular to a plane that is parallel with the display panel is in a range between approximately 0.3 mm and 0.4 mm.

15. The touch-control panel according to claim 1, wherein:
an area size of the each actuator in a plane parallel with the display panel is in a range between approximately 100 mm$^2$ and 10000 mm$^2$.

16. A touch-control device, comprising a touch-control panel including:
a display panel, a first support plate, and at least one actuator, wherein:
the display panel includes a touch-control detection device;
each actuator of the at least one actuator includes a first electrode, a second electrode, and an inductive layer sandwiched between the first electrode and the second electrode, wherein the first electrode is located on a side of the second electrode adjacent to the display panel;
the each actuator further includes a carrier substrate disposed on a surface of the second electrode away from the display panel;
the first support plate includes at least one trench, and the at least one actuator is disposed in the at least one trench;

for the at least one trench and the at least one actuator disposed in the at least one trench, in a direction parallel to a plane of the display panel, a distance between an edge of the carrier substrate and an edge of the at least one trench is less than a distance between an edge of the second electrode and the edge of the at least one trench; and in response to the touch-control detection device detecting a touch-control operation, an actuator of the at least one actuator located in a region where the touch-control operation is performed vibrates.

17. A driving method for a touch-control panel, wherein:
the touch-control panel includes a display panel, a first support plate, at least one actuator, and a central processing module, wherein:
the display panel includes a touch-control detection device;
each actuator of the at least one actuator includes a first electrode, a second electrode, and an inductive layer sandwiched between the first electrode and the second electrode, wherein the first electrode is located on a side of the second electrode adjacent to the display panel;
the each actuator further includes a carrier substrate disposed on a surface of the second electrode away from the display panel;
the first support plate includes at least one trench, and the at least one actuator is disposed in the at least one trench;
for the at least one trench and the at least one actuator disposed in the at least one trench, in a direction parallel to a plane of the display panel, a distance between an edge of the carrier substrate and an edge of the at least one trench is less than a distance between an edge of the second electrode and the edge of the at least one trench; and
the touch-control detection device is connected to the central processing module, and the at least one actuator is connected to the central processing module, the driving method includes:
in response to the touch-control detection device detecting a touch-control operation, receiving position information of the touch-control operation by the central processing module, and controlling an actuator of the at least one actuator located in a region where the touch-control operation is performed to vibrate.

18. The driving method according to claim 17, wherein:
the at least one actuator includes at least two actuators, and
carrier substrates of the at least two actuators have different shapes.

19. The driving method according to claim 17, wherein:
the display panel displays a plurality of function icons, wherein in a direction perpendicular to the display panel, each function icon overlaps with a corresponding actuator; and
in response to the touch-control detection device detecting a touch-control operation is performed on a region where a function icon is located, the central processing module receives the position information of the touch-control operation and controls the actuator located in the region where the touch-control operation is performed to vibrate, and the touch-control panel executes a function corresponding to the function icon on which the touch-control operation is performed.

* * * * *